United States Patent [19]

Kokubo et al.

[11] Patent Number: 5,442,649
[45] Date of Patent: Aug. 15, 1995

[54] SEMICONDUCTOR LASER DEVICE

[75] Inventors: Yoshihiro Kokubo; Seiji Minamihara; Kouji Yamashita; Katsuhiko Goto, all of Itami, Japan

[73] Assignee: Mitsubishi Denki Kabushiki Kaisha, Tokyo, Japan

[21] Appl. No.: 248,727

[22] Filed: May 25, 1994

[30] Foreign Application Priority Data

May 31, 1993 [JP] Japan .................... 5-128621
Sep. 16, 1993 [JP] Japan .................... 5-230393

[51] Int. Cl.⁶ ............................. H01S 3/19
[52] U.S. Cl. ................................. 372/46
[58] Field of Search ........................ 372/46, 45

[56] References Cited

U.S. PATENT DOCUMENTS 4,827,483  5/1989  Fukuzawa et al. ............... 372/45
5,272,712  12/1993  Arimoto et al. ............... 372/45
5,319,660  6/1994  Chen et al. ................... 372/45

FOREIGN PATENT DOCUMENTS 202089  5/1986  European Pat. Off. .
213826  8/1986  European Pat. Off. .
9110263  7/1991  WIPO .

*Primary Examiner*—James W. Davie
*Attorney, Agent, or Firm*—Leydig, Voit & Mayer

[57] ABSTRACT

A semiconductor laser includes a semiconductor substrate of a first conductivity type, a gain guiding structure comprising of a first conductivity type, a lower cladding layer disposed on the substrate, an active layer disposed on the lower cladding layer and having a light emitting region, and an upper cladding layer of a second conductivity type, opposite the first conductivity type, disposed on the active layer, and a multiquantum barrier layer interposed between the upper cladding layer and the active layer excluding the light emitting region. In this structure, the multiquantum barrier layer reduces leakage current flowing outside of the light emitting region of the active layer and increases effective current flowing into the light emitting region, whereby the light output of the laser is significantly increased.

8 Claims, 15 Drawing Sheets

5,442,649

SEMICONDUCTOR LASER DEVICE

FIELD OF THE INVENTION

The present invention relates to semiconductor laser devices employed as optical sources for domestic, industrial, or communication use and, more particularly, to a semiconductor laser device that reduces leakage current and confines electrons in an active layer with high efficiency.

BACKGROUND OF THE INVENTION

FIG. 12 is a sectional view of a prior art gain guiding semiconductor laser. In FIG. 12, again guiding semiconductor laser 500 includes an n type InP substrate 1. There are successively disposed on the n type InP substrate 1 an n type InP lower cladding layer 2, an InGaAsP active layer 3, a p type InP upper cladding layer 5, and a p type InGaAsP contact layer 6. Reference numeral 13 designates a light emitting region of the active layer 3. An insulating film 7, such as $SiO_2$, including a window opposite the light emitting region 13 is disposed on the InGaAsP contact layer 6. A p side electrode 8 is disposed on the insulating film 7, contacting the InGaAsP contact layer 6 through the window in that insulating film 7. An n side electrode 9 is disposed on the rear surface of the substrate 1. Reference numeral 10 designates a current injected into the laser structure from the p side electrode 8, numeral 11 designates effective current flowing into the light emitting region 13 of the active layer 3, and numeral 12 designates leakage current flowing outside of the light emitting region 13. The insulating film 7 is employed to concentrate the injected current toward the light emitting region 13 of the active layer 3.

A method for fabricating the gain guiding semiconductor laser 500 will be described.

Initially, the n type InP lower cladding layer 2, the InGaAsP active layer 3, the p type InP upper cladding layer 5, and the p type InGaAsP contact layer 6 are epitaxially grown on the n type InP substrate 1, preferably by MOCVD (Metal Organic Chemical Vapor Deposition). Thereafter, an insulating film is deposited on the contact layer 6 and patterned to form a window opposite a part to be the light emitting region 13 of the active layer 3. Thereafter, the p side electrode 8 is formed on the insulating film 7, contacting the contact layer 6 through the window of the insulating film 7, and the n side electrode 9 is formed on the rear surface of the substrate 1, completing the gain guiding semiconductor laser 500.

A description is given of the operation.

When a voltage is applied across the p side electrode 8 and the n side electrode 9, current flows from a part of the p side electrode 8 sandwiched by the insulating films 7 toward the n side electrode 9. More specifically, the injected current flows through the p type InGaAsP contact layer 6 and the p type InP upper cladding layer 5 while extending in the transverse direction in these layers and reaches the InGaAsP active layer 3. A part of that current flowing into the light emitting region 13, i.e., the effective current 11, causes laser oscillation.

In this prior art gain guiding semiconductor laser, however, all of the injected current 10 does not flow into the light emitting region 13 of the active layer 3. Some leakage current 12 flows outside of the light emitting region 13. Since the leakage current does not contribute to the laser oscillation, the light output of the laser is reduced. In addition, the magnitude of the leakage current 12 flowing through the active layer 3 varies when the thickness of the active layer 3 varies, and the magnitude of the effective current 11 flowing into the light emitting region varies because of the variation in the leakage current. Therefore, if the active layer 3 is not formed in a prescribed thickness in the production process, a semiconductor laser having desired operating characteristics is not achieved.

FIGS. 13 to 16 are sectional views of a prior art buried heterostructure semiconductor laser. In these figures, a buried heterostructure (hereinafter referred to as BH) semiconductor laser 600 includes a p type InP substrate 21, a p type InP lower cladding layer 22 disposed on part of the substrate 21, an InGaAsP active layer 23 disposed on the lower cladding layer 22, and a first n type InP upper cladding layer 24 disposed on the active layer 23. A stripe-shaped mesa structure 220 comprises the lower and upper cladding layers 22 and 24 and the active layer 23. A p type InP current blocking layer 26 is disposed on part of the substrate 21 and extending up the sides of the mesa structure 220 to the upper cladding layer 24. An n type InP current blocking layer 28 is disposed on parts of the p type InP layer 26. An additional p type InP current blocking layer 29 is disposed on the n type InP layer 28 and parts of the p type InP layer 26. A second n type upper cladding layer 30 is disposed on the p type InP current blocking layer 29 as well as on the top of the mesa structure 220, i.e., in contact with the first n type InP upper cladding layer 24. An n type InGaAsP contact layer 31 is disposed on the n type InP upper cladding layer 30. An n side electrode 9 is disposed on the contact layer 31, and a p side electrode 8 is disposed on the rear surface of the substrate 21. Reference numeral 10 designates a current injected into the laser structure from the p side electrode 8. Reference numeral 230 designates an effective current path. Reference numerals 231, 232, 233, and 234 designate first, second, third, and fourth leakage current paths, respectively.

A method for fabricating the BH semiconductor layer 600 will be described.

Initially, the p type InP cladding layer 22, the InGaAsP active layer 23, and the first n type InP upper cladding layer 24 are epitaxially grown on the p type InP substrate 21, preferably by MOCVD. Thereafter, the p type InP substrate 21 and those layers 22, 23, and 24 epitaxially grown on the substrate 21 are formed in a stripe-shaped mesa by conventional photolithography and etching techniques. Thereafter, the p type InP current blocking layer 26, the n type InP current blocking layer 28, and the additional p type InP current blocking layer 29 are successively grown on the substrate 21 contacting the opposite sides of the mesa structure. Preferably, these current blocking layers are grown by LPE (Liquid Phase Epitaxy). Thereafter, the second n type InP upper cladding layer 30 is epitaxially grown on the p type InP layer 29 and on the top of the mesa structure and, successively, the n type InGaAsP contact layer 31 is grown on the upper cladding layer 30. To complete the laser structure shown in FIG. 13, the p side electrode 8 is formed on the rear surface of the p type InP substrate 2 and the n side electrode 9 is formed on the n type InGaAsP contact layer 31.

A description is given of the operation.

When a voltage is applied across the p side electrode 8 and the n side electrode 9, current 10 flows between these electrodes. Most of the current flows along the current path 230, through the upper and lower cladding layers and the active layer, whereby laser oscillation occurs.

However, some leakage current flows along the path 231 through the p type InP substrate 21, the p type InP current blocking layer 26, and the n type InP upper cladding layer 24 (first leakage current path) as shown in FIG. 13 and along the path 232 through the p type InP substrate 21, the p type InP current blocking layer 26, the p type InP current blocking layer 29, and the n type InP upper cladding layer 30 (second leakage current path) as shown in FIG. 14. In other words, since these current paths 231 and 232 include forward-biased junctions, all of the current 10 injected into the laser structure does not flow into the active layer 23, i.e., some leakage current flows along these current paths 231 and 232. The leakage current does not contribute to the laser oscillation. Further, the p type InP current blocking layer 26, the n type InP current blocking layer 28, the p type InP current blocking layer 29, and the n type InP upper cladding layer 30 provide a pnpn thyristor structure, and very few charge carriers are present in the respective layers. Therefore, usually, leakage current hardly flows along the path 233 shown in FIG. 15 through those current blocking layers 26, 28, 29 and the upper cladding layer 30 (third leakage current path). However, when the thickness of the n type InP current blocking layer 28 is reduced in the production process for some reason or when the laser is operated at a high voltage, leakage current flows along the path 233. Further, when these current blocking layers are grown on opposite sides of the stripe-shaped mesa 220 by LPE, it is very difficult to control the thicknesses of these layers. The poor controllability of thicknesses sometimes causes unwanted contact between the n type InP current blocking layer 28 and the n type InP cladding layer 24 in the laser structure as shown in FIG. 16, producing a fourth leakage current path 234 through the p type InP substrate 21, the p type InP current blocking layer 26, the n type InP current blocking layer 28, and the n type InP cladding layer 24.

As described above, in the prior art BH semiconductor laser, some leakage current flows through the current blocking layers disposed at the opposite sides of the stripe-shaped mesa, whereby the light output of the laser is reduced. In addition, strain in the analog modulation cannot be reduced. Further, when the thicknesses of the current blocking layers vary, the magnitude of the leakage current flowing through the current blocking layers varies, whereby the magnitude of the effective current flowing into the active layer also varies. Therefore, if the current blocking layers are not formed in prescribed thicknesses in the production process, a semiconductor laser with desired operating characteristics cannot be achieved.

FIG. 17 is a sectional view illustrating a prior art BH semiconductor laser including a multiquantum barrier layer (hereinafter referred to as MQB layer) interposed between an active layer and a cladding layer. In the figure, a BH semiconductor laser 700 includes a p type InP substrate 1. An n type InP lower cladding layer 12a is disposed on the substrate 1. An InGaAsP active layer 23 is disposed on part of the lower cladding layer 12a. An MQB layer 25 comprising alternating InGaAsP barrier layers and InGaAsP well layers is disposed on the active layer 23. A p type InP upper cladding layer 22a is disposed on the MQB layer 25. A stripe-shaped mesa structure 220a includes the active layer 23, the MQB layer 25, and the upper cladding layer 22a. A p type InP current blocking layer 26 is disposed on part of the lower cladding layer 12a and extending up the sides of the mesa structure 220a to the upper cladding layer 22a. An n type InP current blocking layer 28 is disposed on the p type InP layer 26. An additional p type InP current blocking layer 29 is disposed on the n type InP layer 28. A p type InGaAsP contact layer 6 is disposed on the p type InP current blocking layer 29 as well as on the top of the mesa 220a, i.e., in contact with the p type InP upper cladding layer 22a. A p side electrode 8 is disposed on the contact layer 6 and an n side electrode 9 is disposed on the rear surface of the substrate 1. In this BH laser 700, the conductivity types of the respective layers are opposite to those of the BH laser 600 shown in FIG. 13.

The production process of this BH semiconductor laser 700 is identical to that already described with respect to the semiconductor laser 600 shown in FIG. 13 except that the MQB layer 25 is formed between the InGaAsP active layer 23 and the p type InP upper cladding layer 22a.

A description is given of the operation.

When a voltage is applied across the p side electrode 8 and the n side electrode 9, electrons and holes are injected into the active layer 23 from the n type InP lower cladding layer 12a and the p type InP upper cladding layer 22a, respectively. These electrons and holes recombine in the active layer to produce laser light, resulting in laser oscillation. During the laser oscillation, since the effective mass of electrons is several times smaller than the effective mass of holes, a part of electrons injected into the active layer 23 from the lower cladding layer 12a do not recombine with holes but flow toward the p type InP upper cladding layer 22a across the active layer 23. These leaking electrons reduce the luminous efficiency of the laser. In addition, the leakage of electrons is encouraged when the temperature in the vicinity of the active layer increases and the number of electrons having high potential energy increase. The MQB layer 25 reduces the unwanted leakage of electrons from the active layer 23 to the upper cladding layer 22a. That is, the MQB layer 25 provides a potential barrier having an effective energy larger than the band gap energy of the upper cladding layer 22a between the active layer 23' and the upper cladding layer 22a, whereby the leakage of electrons is reduced.

FIG. 18 is a sectional view of a part of the BH laser 700 shown in FIG. 17 in the vicinity of the active layer 23, showing electrons (⊖) and holes (⊕) during the laser oscillation. As shown in FIG. 18, although the MQB layer 25 reduces the leakage electrons from the active layer 23 to the p type upper cladding layer 22a, some electrons in the active layer 23 still leak to the p type current blocking layer 26. Therefore, even the MQB layer 25 does not adequately reduce the leakage of electrons so that the luminous efficiency of the output laser light can be increased to a satisfying level.

Furthermore, in the above-described prior art semiconductor laser devices 500, 600, and 700, since the leakage current increases as the injected current or the operating temperature increases, output characteristics and temperature characteristics of these prior art lasers are not improved.

SUMMARY OF THE INVENTION

An object of the present invention is to provide a semiconductor laser device that produces a high power output with reduced leakage current.

Another object of the present invention is to provide a semiconductor laser device that reduces leakage of electrons once injected into the active layer toward the p type semiconductor layer contacting the active layer.

Still another object of the present invention is to provide a semiconductor laser device in which the operating characteristics are not adversely affected by variations in the thickness of the active layer or the current blocking layer.

According to a first aspect of the present invention, a gain guiding semiconductor laser includes a multiquantum barrier layer interposed between part of an active layer excluding a light emitting region and a cladding layer. Since the multiquantum barrier layer reduces the leakage current flowing outside of the light emitting region of the active layer, the effective current flowing into the light emitting region is increased. In addition, since the leakage current is reduced, the variation in the quantity of the leakage current due to variation in the thickness of the active layer is reduced, whereby the variation in magnitude of the effective current is reduced, resulting in a semiconductor laser with stable operating characteristics.

According to a second aspect of the present invention, a buried heterostructure semiconductor laser includes a multiquantum barrier layer disposed between at least one of a mesa-shaped double heterojunction structure and a current blocking structure on opposite sides of the mesa, a first conductivity type semiconductor layer and a second conductivity type semiconductor layer both included in the current blocking structure, and and a cladding layer disposed on the current blocking structure. Therefore, leakage current flowing outside of the active layer in the mesa structure is reduced, whereby the effective current flowing through the active layer is increased. Further, since the leakage current is reduced, the variation in magnitude of the leakage current due to variations in the thickness of the active layer is reduced, whereby variation in the magnitude of the effective current is reduced, resulting in stable laser operating characteristics.

According to a third aspect of the present invention, a buried heterostructure semiconductor laser including a multiquantum barrier layer interposed between an active layer included in a stripe-shaped mesa structure and a p type cladding layer further includes an additional multiquantum barrier layer interposed between opposite sides of the mesa structure and a current blocking structure. Therefore, the leakage current flowing outside of the active layer of the mesa structure is reduced, whereby the effective current flowing through the active layer is increased. Further, the additional multiquantum barrier layer prevents electrons once injected into the active layer from flowing into a p type layer contacting the active layer.

According to a fourth aspect of the present invention, a buried crescent semiconductor laser includes a multiquantum barrier layer at either or both of two junctions between a first conductivity type semiconductor layer and a second conductivity type semiconductor layer both included in a current blocking structure and between the current blocking structure and a lower cladding layer. Therefore, leakage current flowing outside of a buried active layer is reduced, whereby the effective current flowing through the active layer is increased.

Other objects and advantages of the invention will become apparent from the detailed description that follows. The detailed description and specific embodiments described are provided only for illustration since various additions and modifications within the scope of the invention will be apparent to those of skill in the art from the detailed description.

DETAILED DESCRIPTION OF THE PREFERRED EMBODIMENTS

Figure 1:
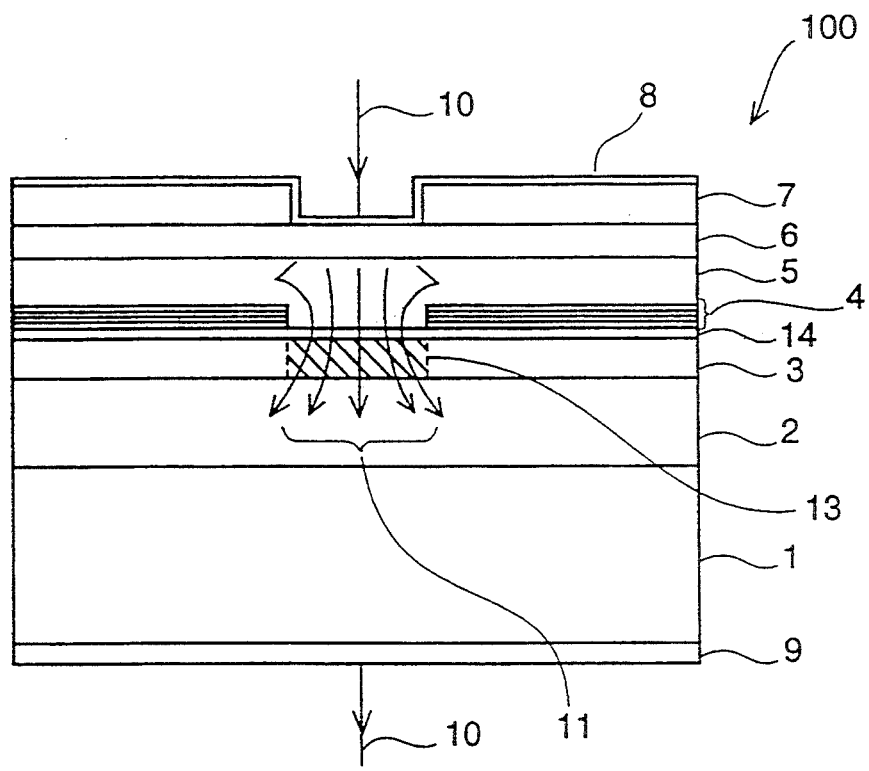
FIG. 1 is a sectional view schematically illustrating a gain guiding semiconductor laser in accordance with a first embodiment of the present invention.
Figure 12:
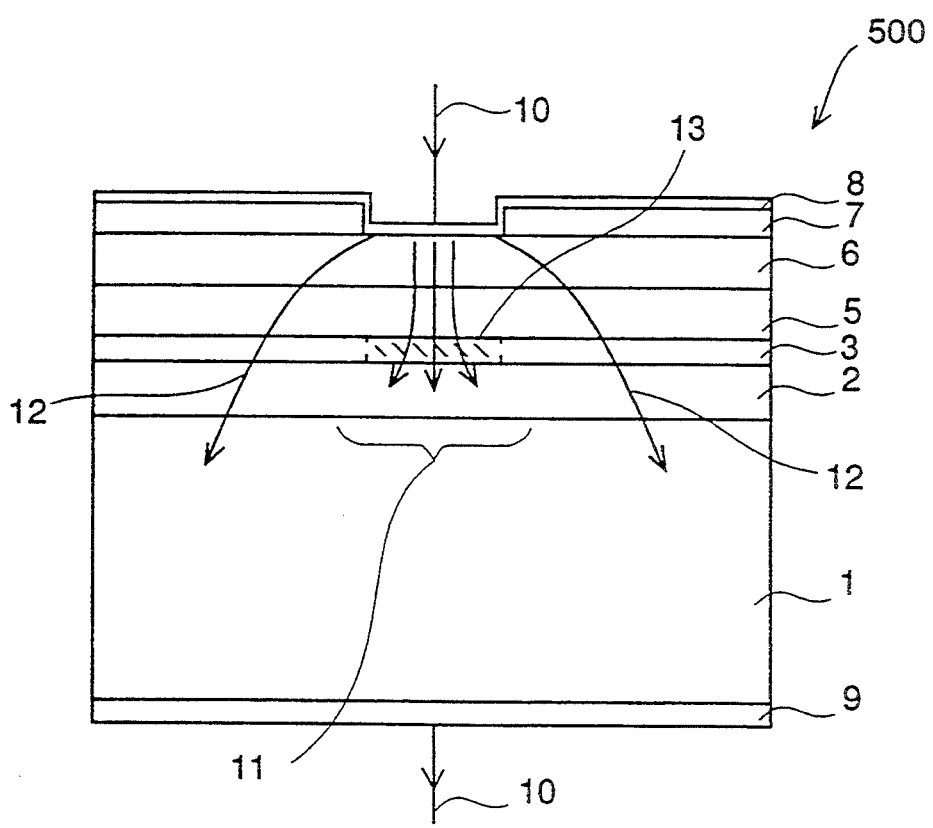
FIG. 12 is a sectional view schematically illustrating a gain guiding semiconductor laser according to the prior art.

FIG. 1 is a sectional view schematically illustrating a gain guiding semiconductor laser in accordance with a first embodiment of the present invention. In the figure, the same reference numerals as in FIG. 12 designate the same or corresponding parts. A gain guiding semiconductor laser 100 includes an n type InP substrate 1. An n type InP cladding layer 2 is disposed on the substrate 1. An InGaAsP active layer 3 including a light emitting region 13 is disposed on the cladding layer 2. A p type InP etch stopping layer 14 is disposed on the active layer 3. A multiquantum barrier (MQB) layer 4 having an opening opposite the light emitting region 13 of the active layer 3 is disposed on the etch stopping layer 14. The MQB layer 4 comprises ten to twenty $In_{0.52}Al_{0.48}As$ well layers 2~3 nm thick and ten to twenty $In_{0.53}Ga_{0.47}As$ barrier layers 2~3 nm thick which are alternatingly arranged. A p type InP cladding layer 5 is disposed on the MQB layer 4 and on the etch stopping layer 14. A p type InGaAsP contact layer 6 is disposed on the p type InP cladding layer 5. An insulating film 7, such as $SiO_2$, having a window opposite the light emitting region 13 of the active layer 3 is disposed on the contact layer 6. A p side electrode 8 is disposed on the insulating film 7, contacting the contact layer 6 through the window in that insulating film 7. An n side electrode 9 is disposed on the rear surface of the substrate 1.

FIGS. 2(a)-2(d) are sectional views illustrating process steps in a method for fabricating the semiconductor laser of FIG. 1.

Figure 2:
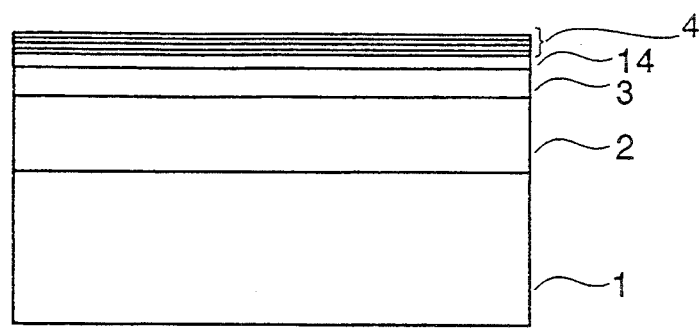
FIGS. 2(a)-2(d) are sectional views illustrating process steps in a method for fabricating the semiconductor laser of FIG. 1.
Figure 2:
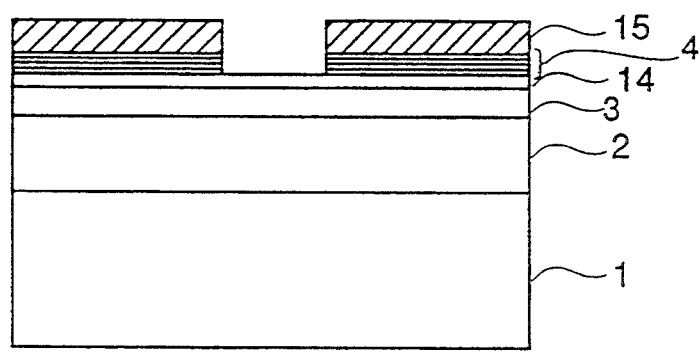
Figure 2:
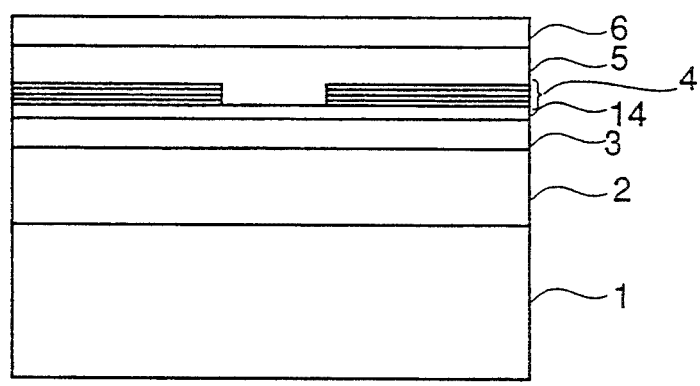
Figure 2:
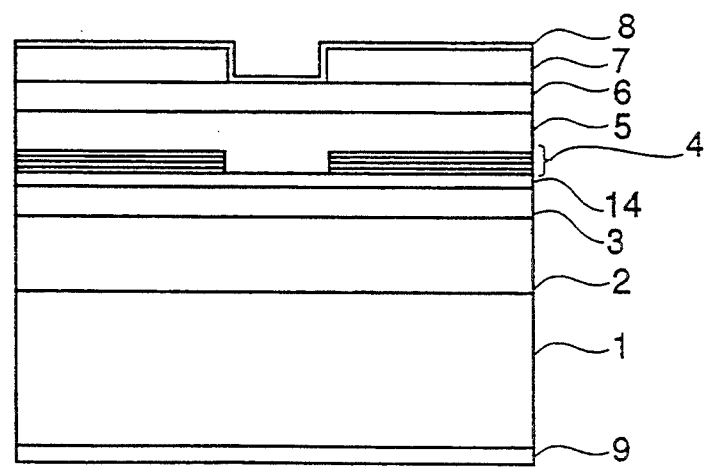

Initially, as illustrated in FIG. 2(a), an n type InP lower cladding layer 2, an InGaAs active layer 3, a p type InP etch stopping layer 14, and an MQB layer 4 are successively epitaxially grown on the n type InP substrate 1. Preferably, these layers are grown by MOCVD at a temperature of 600°~650° C.

In the step of FIG. 2(b), a photoresist pattern 15 having a window opposite what becomes a light emitting region of the active layer 3 is formed on the MQB layer 4. Using the photoresist pattern 15 as a mask, the MQB layer 4 is selectively etched by chemical etching until the surface of the etch stopping layer 14 is exposed in that window of the insulating film 7.

After removal of the photoresist pattern 15, as illustrated in FIG. 2(c), a p type InP upper cladding layer 5 and a p type InGaAsP contact layer 6 are successively epitaxially grown on the MQB layer 4 and the etch stopping layer 14. Preferably, these layers are grown by MOCVD or LPE.

In the step of FIG. 2(d), an insulating film 7, such as $SiO_2$, is deposited over the p type InGaAsP contact layer 6 and patterned to form a window opposite the light emitting region of the active layer 3. To complete the laser structure shown in FIG. 1, an n side electrode 9 is formed on the rear surface of the substrate 1 and a p side electrode 8 is formed on the insulating film 7, contacting the contact layer 6 through the window of the insulating film 7.

A description is given of the operation.

Figure 8:
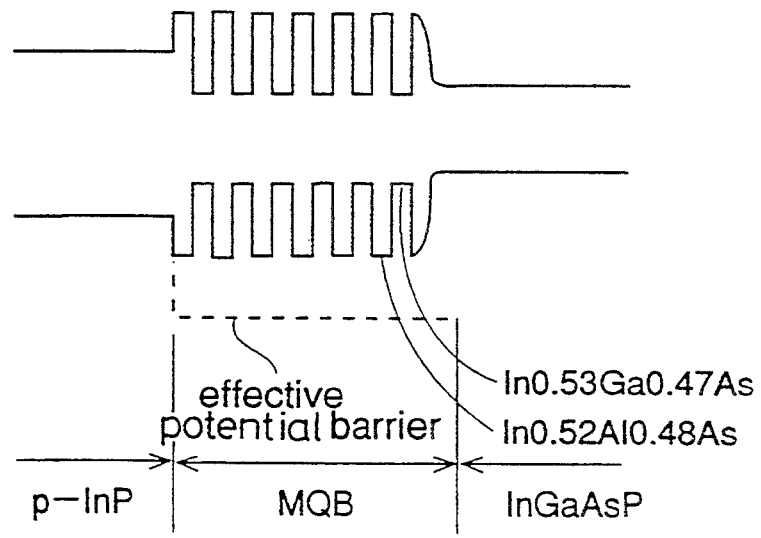
FIG. 8(a) is an energy band diagram of a part of the gain guiding semiconductor laser shown in FIG. 1
FIG. 8(b) is an energy band diagram of a part of the buried heterostructure semiconductor laser shown in FIG. 3.
Figure 8:
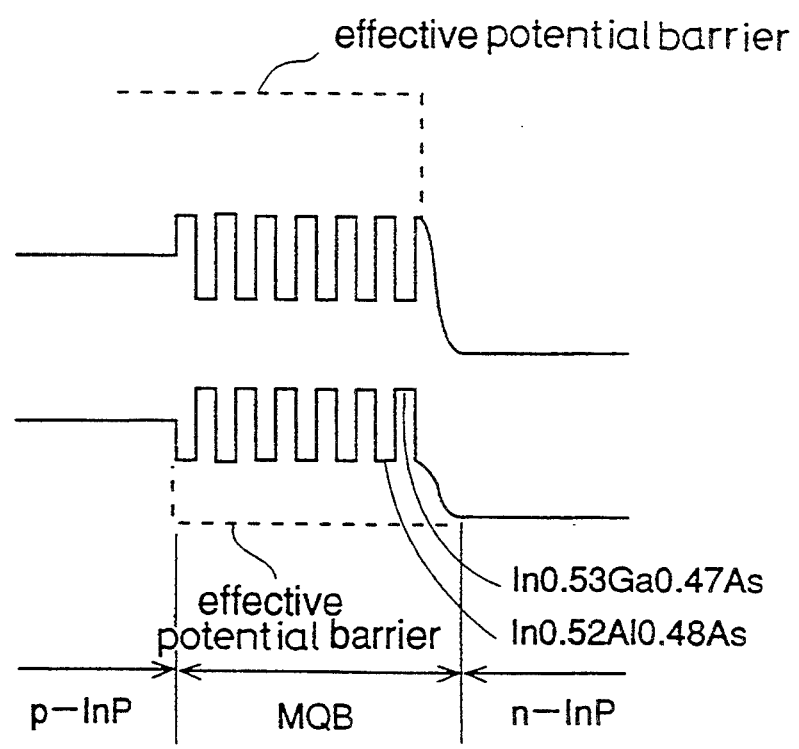

FIG. 8(a) is an energy band diagram of a part of the laser structure of FIG. 1 including the p type InP cladding layer 5, the MQB layer 4, and the InGaAsP active layer 3. The etch stopping layer 14 is omitted in FIG. 8(a) because it is very thin and does not affect the operation of the laser. As shown in FIG. 8(a), the MQB layer 4 interposed between the p type InP layer 5 and the InGaAsP active layer 3 provides a potential barrier having an effective energy larger than the band gap energy of the p type InP layer 5. Therefore, when a voltage is applied across the p side electrode 8 and the n side electrode 9 to operate the laser, most of the current 10 injected into the laser structure from the p side electrode 8 flows through the narrow portion of the p type InP upper cladding layer 5 sandwiched by the MQB layers 4. The current flows into the light emitting region 13 of the active layer 3 as an effective current 11 because the majority carriers in the p type InP cladding layer 5, i.e., holes, are reflected by the potential barrier produced by the MQB layer 4. Therefore, the light output is increased and the output characteristics and the temperature characteristics of the laser are improved compared to the prior art laser. In the prior art laser shown in FIG. 12, the magnitude of the effective current varies with the magnitude of the leakage current caused by variations in the thickness of the active layer. In the laser structure of this first embodiment, however, since the leakage current is significantly reduced, the unwanted variation in the effective current is avoided. Therefore, even when the thickness of the active layer varies in the production process, a semiconductor device with desired operating characteristics is produced with high reliability.

Although the first embodiment of the invention illustrated in FIG. 1 includes the MQB layer 4 between the upper cladding layer 5 and the active layer 3, excluding the light emitting region 13, the MQB layer 4 may be interposed between the lower cladding layer 2 and the active layer 3, or MQB layers may be interposed between the active layer and both of the upper and lower cladding layers.

Figure 3:
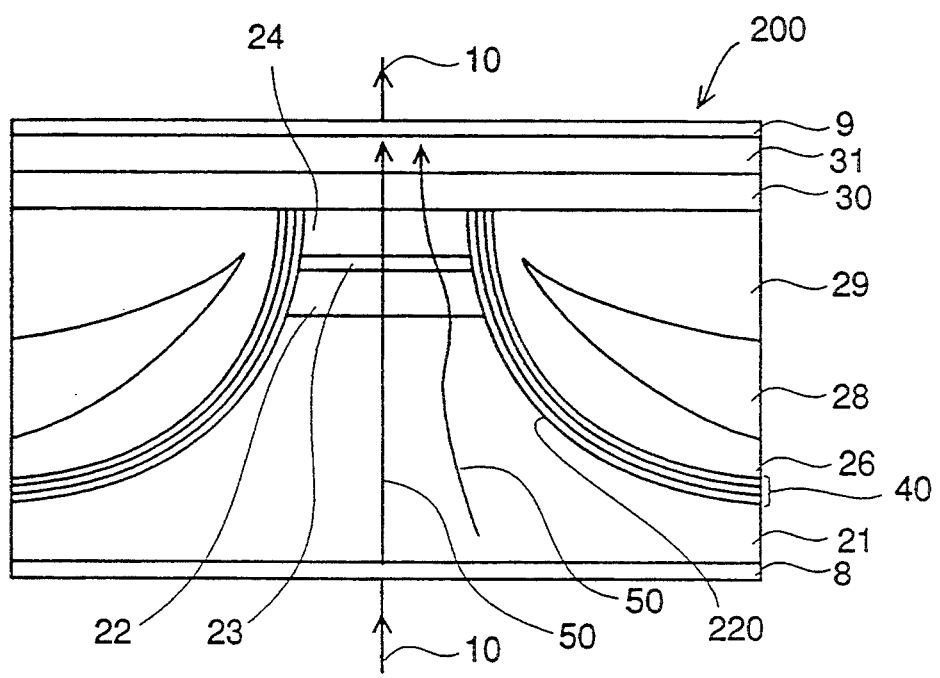
FIG. 3 is a sectional view schematically illustrating a buried heterostructure semiconductor laser in accordance with a second embodiment of the present invention.
Figure 13:
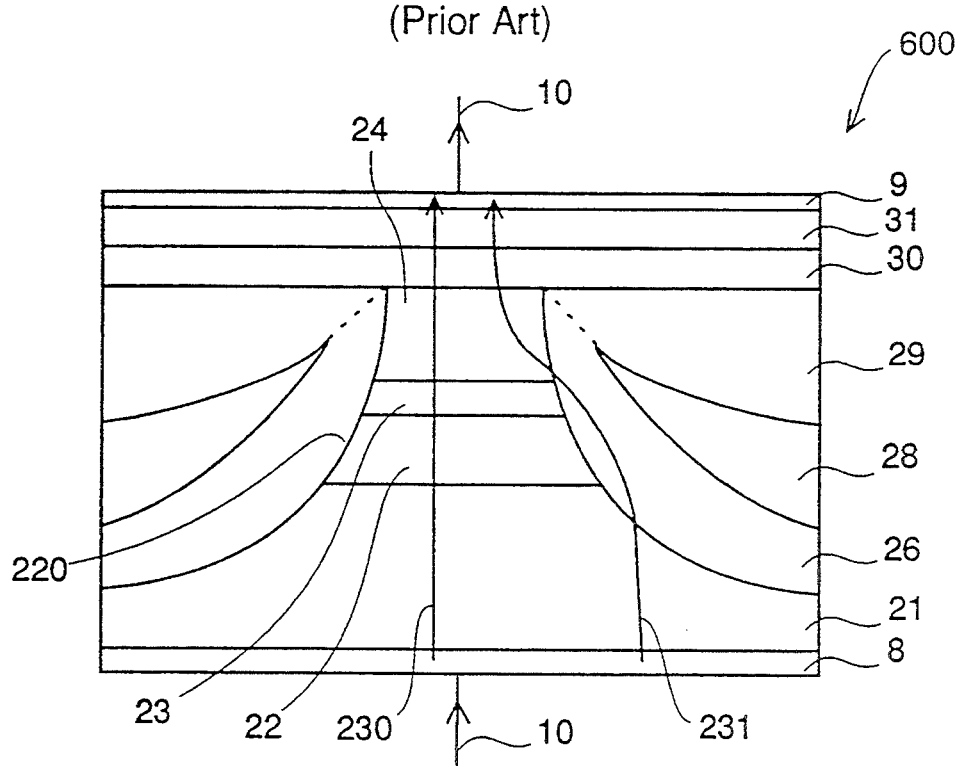
FIGS. 13, 14, 15, and 16 are sectional views of a buried heterostructure semiconductor laser according to the prior art, for explaining leakage current paths in the laser structure.

FIG. 3 is a sectional view schematically illustrating a BH semiconductor laser in accordance with a second embodiment of the present invention. In FIG. 3, the same reference numerals as in FIG. 13 designate the same or corresponding parts. The laser structure shown in FIG. 3 is fundamentally identical to the prior art laser structure shown in FIG. 13 except that MQB layers 40 are interposed between the opposite sides of the mesa structure 220 and the current blocking structure comprising the InP current blocking layers 26, 28, and 29. The MQB layer 40 comprises, alternatingly arranged, ten to twenty $In_{0.52}Al_{0.48}As$ well layers 2~3 nm thick and ten to twenty $In_{0.53}Ga_{0.47}As$ barrier layers 2~3 nm thick. Reference numeral 50 designates an effective current flowing through the active layer.

A method for fabricating the laser structure of FIG. 3 is illustrated in FIGS. 4(a)~4(f).

Figure 4:
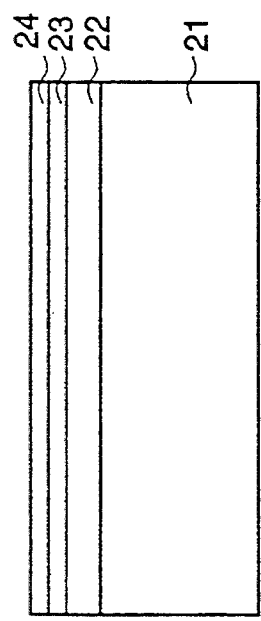
FIGS. 4(a)-4(f) are sectional views illustrating process steps in a method for fabricating the semiconductor laser of FIG. 3.
Figure 4:
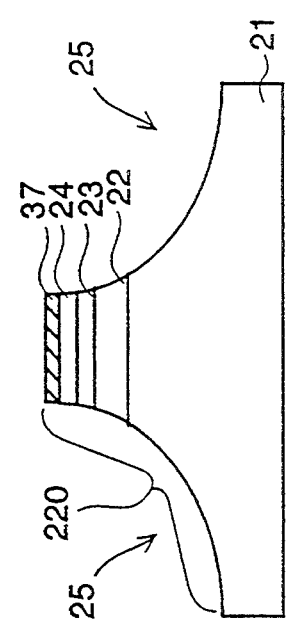
Figure 4:
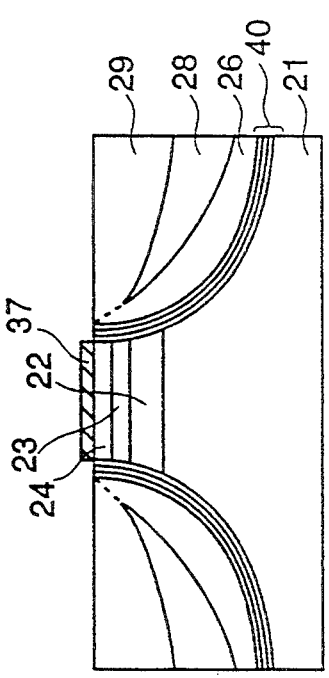
Figure 4:
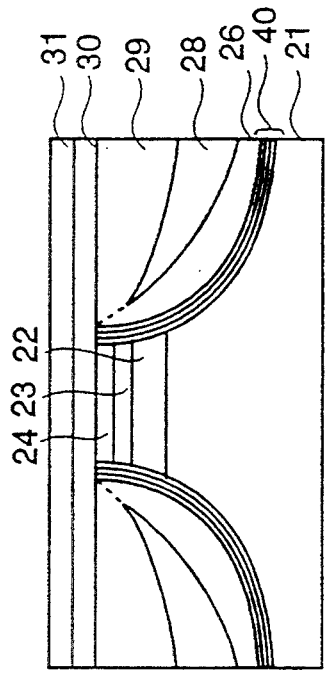
Figure 4:
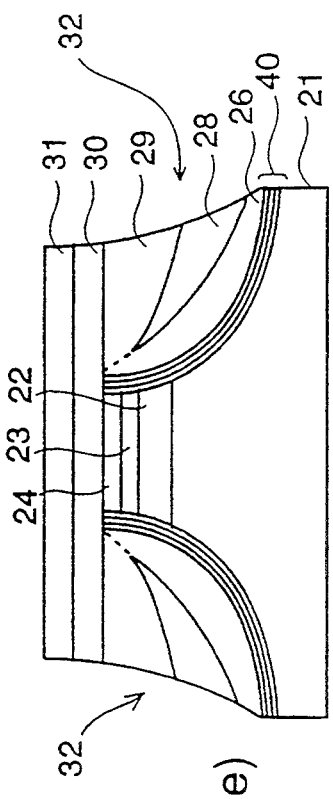
Figure 4:
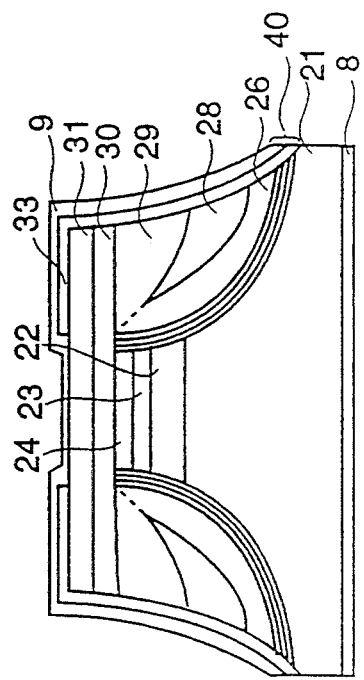

Initially, as illustrated in FIG. 4(a), a p type InP lower cladding layer 22, an InGaAsP active layer 23, and an n type InP upper cladding layer 24 are successively epitaxially grown on the p type InP substrate 21, preferably by MOCVD. Thereafter, an insulating film is deposited over the entire surface of the upper cladding layer 22 and patterned in a narrow stripe shape by conventional photolithography and etching techniques.

In the step of FIG. 4(b), using the stripe-shaped insulating film 37 as an etching mask, the upper cladding layer 24, the active layer 23, the lower cladding layer 22, and the substrate 21 are subsequently etched to form a stripe-shaped mesa 220. Preferably, these layers are wet-etched using HBr as an etchant.

In the step of FIG. 4(c), using the insulating film 37 as a mask for selective growth, an MQB layer 40 is epitaxially grown on the substrate 21, contacting the opposite sides of the mesa structure 220 and, subsequently, a p type InP current blocking layer 26, an n type InP current blocking layer 28, and a p type InP current blocking layer 29 are epitaxially grown on the MQB layer 40.

After removal of the insulating film 37, a second n type InP upper cladding layer 30 and an n type InGaAsP contact layer 31 are successively grown by MOCVD, as illustrated in FIG. 4(d).

Thereafter, a photoresist mask (not shown) is formed on the contact layer, and the structure is etched at the side surfaces to form a mesa shape 32 (FIG. 4(e)) in order to reduce parasitic capacitances that arise at the pn junctions between the current blocking layers 26, 28, and 29.

In the step of FIG. 4(f), an insulating film 33, such as $SiO_2$, having a window opposite the stripe-shaped mesa is formed on the top and side surfaces of the laser structure. This insulating film 33 improves the current injection efficiency of the stripe-shaped mesa structure 220. To complete the BH laser 200 shown in FIG. 3, an n side electrode 9 is formed on the insulating film 33, contacting the contact layer 31 through the window of that insulating film, and a p side electrode 8 is formed on the rear surface of the substrate 21.

In the above-described production process, after the formation of the contact layer 31, the whole structure is formed in a mesa shape and the insulating film 33 is deposited on the mesa structure and, thereafter, the n side electrode 9 is formed on the insulating film 33. However, the formation of the mesa shape and the deposition of the insulating film 33 may be dispensed with. That is, the p side electrode 9 may be formed directly on the contact layer 31 in the step shown in FIG. 4(d).

In the above-described production process, the formation of the mesa structure (FIG. 4(b)) and the growth of the MQB layer 40 and the current blocking layers 26, 28, and 29 (FIG. 4(c)) are carried out using the insulating film 37 as a mask. However, the mesa structure 220 may be formed using a photoresist pattern as a mask and after removal of the photoresist pattern, the MQB layer and the current blocking layers may be grown on opposite sides of the mesa structure 220 by LPE at a temperature of 600°~650° C., followed by the growth of the n type InP upper cladding layer 30 and the n type InGaAsP contact layer 31.

A description is given of the operation.

Figure 15:
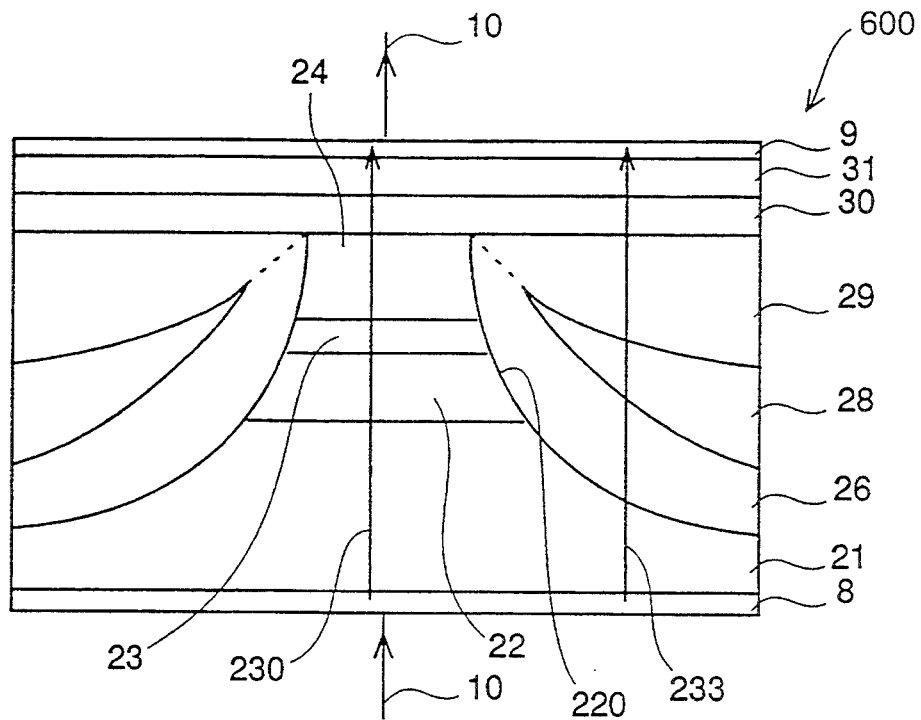

In the laser structure shown in FIG. 3, when a voltage is applied across the n side electrode 9 and the p side electrode 8, a current 10 flows between these electrodes. An effective current 50 flows through the active layer 23, whereby laser oscillation occurs. FIG. 8(b) is an energy band diagram of a part of the laser structure of FIG. 3 including the p type InP current blocking layer 26, the MQB layer 40, and the n type InP upper cladding layer 24. As shown in FIG. 8(b), the MQB layer 40 interposed between the side surface of the mesa structure 220 and the p type InP current blocking layer 26 provides a potential barrier having an effective energy larger than the band gap energy of the n type InP upper cladding layer 24 at the junction between the p type InP current blocking layer 26 and the MQB layer 40. The MQB layer 40 also provides a potential barrier having an effective energy larger than the band gap energy of the p type InP current blocking layer 26 at the junction between the n type InP upper cladding layer 24 and the MQB layer 40. These potential barriers reduce the unwanted flow of holes and electrons between the p type InP current blocking layer 26 and the n type InP upper cladding layer 24, so that the first leakage current 231 shown in FIG. 13 hardly flows. Since these potential barriers also prevent the majority carriers in the p type InP substrate 1, i.e., holes, from flowing through the p type InP current blocking layer 26 toward the n type InP current blocking layer 24, unwanted turn on of the pnpn thyristor structure shown in FIG. 15 is avoided, whereby the third leakage current 233 does not flow.

In the BH laser according to this second embodiment of the present invention, the leakage current flowing through the current blocking layers is reduced as compared to the prior art laser, whereby the effective current 50 flowing through the active layer 23 of the mesa structure 220 is significantly increased. Therefore, the light output is increased and the output characteristics and the temperature characteristics of the laser are improved compared to the prior art laser. In the prior art laser structure shown in FIG. 13, the magnitude of the effective current varies with the variations in the magnitude of the leakage current caused by variations in the thicknesses of those current blocking layers. In the laser structure of this second embodiment, however, since the leakage current is significantly reduced, the unwanted variation in the effective current is avoided. Therefore, even when the thicknesses of the current blocking layers vary in the production process, a semiconductor device with desired operating characteristics is produced with high reliability.

Figure 5:
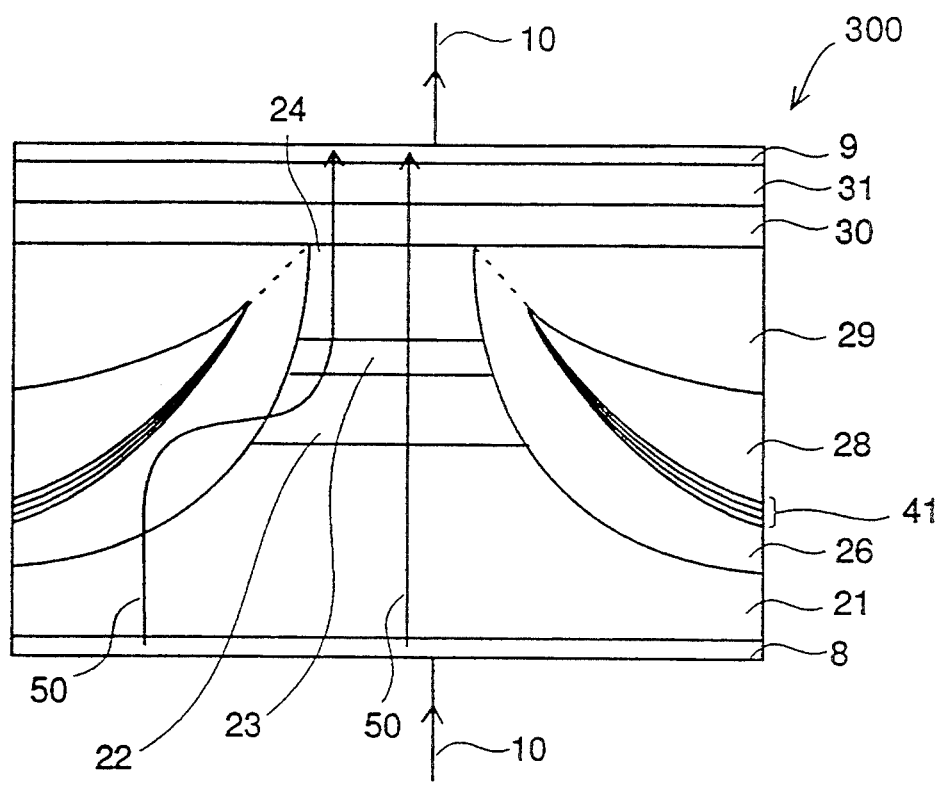
FIGS. 5(a) and 5(b) are sectional views schematically illustrating buried heterostructure semiconductor lasers in accordance with a third embodiment of the present invention.
Figure 5:
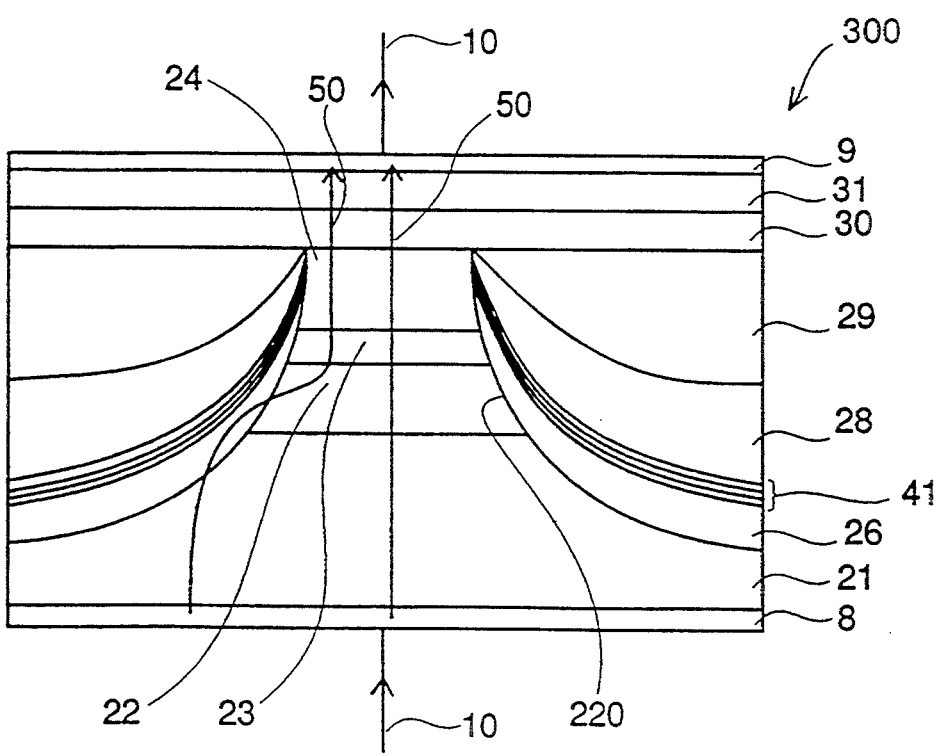

FIG. 5(a) is a sectional view schematically illustrating a BH semiconductor laser in accordance with a third embodiment of the present invention. In the figure, the same reference numerals as fn FIG. 13 designate the same or corresponding parts. A BH laser 300 of this third embodiment is fundamentally identical to the prior art laser structure shown in FIG. 13 except that an MQB layer 41 is interposed between the p type InP current blocking layer 26 and the n type InP current blocking layer 28. The MQB layer 41 comprises, alternatingly arranged, ten to twenty $In_{0.52}Al_{0.48}As$ well layers 2~3 nm thick and ten to twenty $In_{0.53}Ga_{0.47}As$ barrier layers 2~3 nm thick.

The production method of this BH laser 300 is fundamentally identical to that of the BH laser 200 already described with respect to FIGS. 4(a)-4(f). In this third embodiment, when the current blocking layers are successively grown at opposite sides of the mesa 220, the MQB layer 41 is grown between the p type InP current blocking layer 26 and the n type InP current blocking layer 28.

Figure 16:
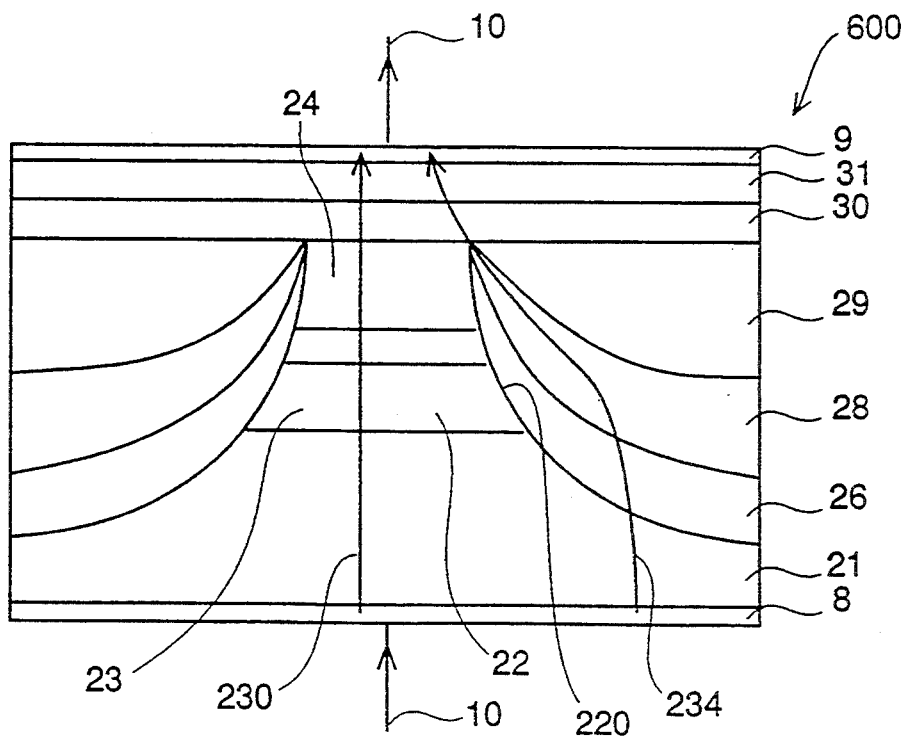

In this BH laser 300, the MQB layer 41 interposed between the n type InP current blocking layer 28 and the p type InP current blocking layer 26 provides the same potential barriers as described in the second embodiment of the invention at the junctions between the n type InP current blocking layer 28 and the MQB layer 41 and between the p type InP current blocking layer 26 and the MQB layer 41. Since these potential barriers reduce unwanted transfer of holes and electrons between the p type InP current blocking layer 26 and the n type InP current blocking layer 28, the turn-on of the pnpn thyristor structure shown in FIG. 15 is avoided, so that the third leakage current 233 does not flow. Especially when the n type InP current blocking layer 28 is in contact with the n type InP upper cladding layer 24 as shown in FIG. 5(b), the fourth leakage current 234 shown in FIG. 16 is significantly reduced because the MQB layer 41 reduces the transfer of holes and electrons between the p type InP current blocking layer 26 and the n type InP current blocking layer 28 as described above.

Also in the BH laser 300 according to the third embodiment of the invention, the effective current 50 flowing through the active layer 23 of the mesa structure 220 is significantly increased by the reduction in the leakage current, whereby the light output is increased and the output characteristics and the temperature characteristics of the laser are improved compared to the prior art laser.

Figure 6:
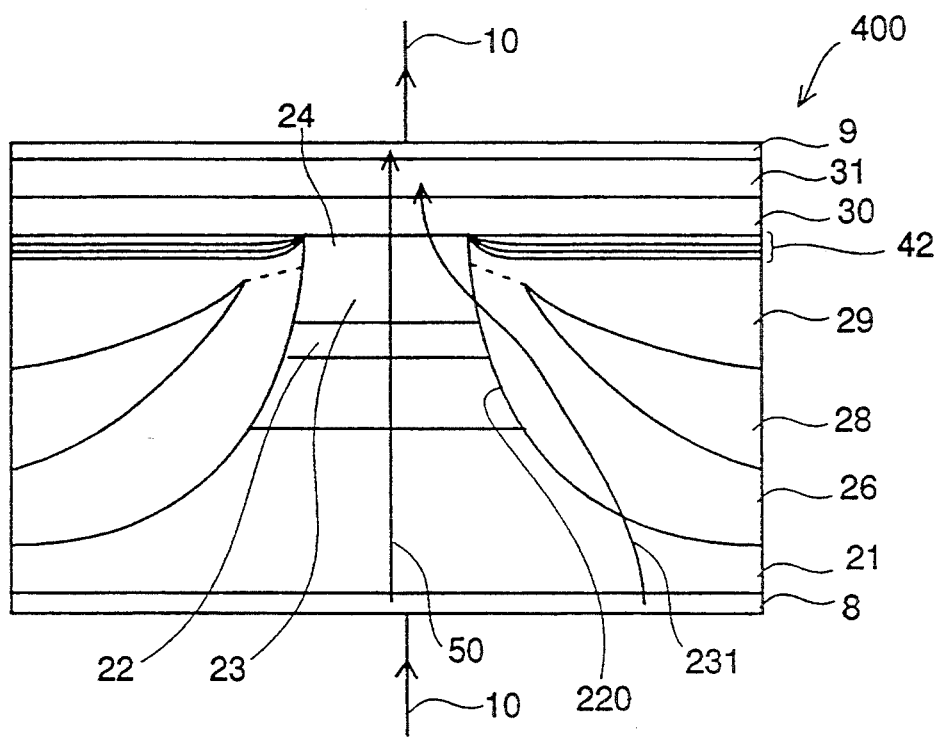
FIG. 6 is a sectional view schematically illustrating a buried heterostructure semiconductor laser in accordance with a fourth embodiment of the present invention.

FIG. 6 is a sectional view schematically illustrating a BH laser in accordance with a fourth embodiment of the present invention. In the figure, the same reference numerals as those in FIG. 13 designate the same or corresponding parts. A BH laser 400 of this fourth embodiment is fundamentally identical to the prior art laser structure shown in FIG. 13 except that an MQB layer 42 is interposed between the p type InP current blocking layer 29 and the n type InP upper cladding layer 30. The MQB layer 42 comprises, alternatingly arranged ten to twenty $In_{0.52}Al_{0.48}As$ well layers 2~3 nm thick and ten to twenty $In_{0.53}Ga_{0.47}As$ barrier layers 2~3 nm thick.

The production method of this BH laser 400 is fundamentally identical to that of the BH laser 200 already described with respect to FIGS. 4(a)-4(f) except that when the current blocking layers are successively grown at opposite sides of the mesa 220, the MQB layer 42 is grown on the p type InP current blocking layer 29.

Figure 14:
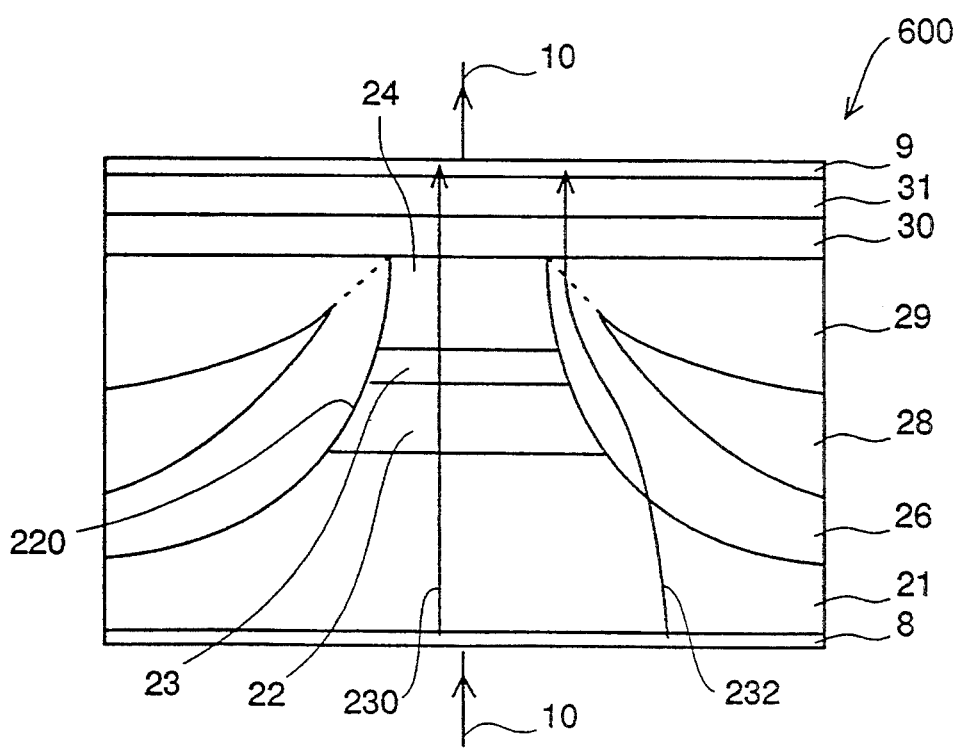

In this BH laser 400, the MQB layer 42 interposed between the n type InP upper cladding layer 30 and the p type InP current blocking layer 29 provides the same potential barriers as described in the second embodiment of the invention at the junction between the p type InP current blocking layer 29 and the MQB layer 42 and at the junction between the n type InP upper cladding layer 30 and the MQB layer 42. Since these potential barriers reduce the transfer of holes and electrons between the p type InP current blocking layer 29 and the n type InP upper cladding layer 30, the second leakage current 232 shown in FIG. 14 is significantly reduced. In addition, since the MQB layer 42 prevents the unwanted turn-on of the pnpn thyristor structure shown in FIG. 15, the third leakage current 233 shown in FIG. 15 does not flow.

Also in the BH laser 400 according to the fourth embodiment of the invention, the effective current 50 flowing through the active layer 23 of the mesa structure 220 is significantly increased by the reduction in the leakage current, whereby the light output is increased and the output characteristics and the temperature characteristics of the laser are improved compared to the prior art laser.

Each of the above-described BH lasers 200, 300, and 400 according to the second, third, and fourth embodiments of the invention, respectively, cannot reduce all of the first to fourth leakage currents 231 to 234 shown in FIGS. 13-16. Therefore, these BH lasers may be combined to provide a laser structure that reduces the first to fourth leakage currents at the same time.

Although the above-described first to fourth embodiments of the present invention employ an MQB layer including the $In_{0.52}Al_{0.48}As$ well layer and the $In_{0.53}Ga_{0.47}As$ barrier layer which have lattice constants matching with the lattice constant of InP, an MQB layer including barrier or well layers with a lattice constant that does not match with the lattice constant of InP, i.e., a strained MQB layer, may be employed. For example, assuming that the barrier layer comprises $In_{0.3}Al_{0.7}As$ and the well layer comprises $In_{0.52}Al_{0.48}As$, the band gap energy of the barrier layer is about 0.45 eV larger than the band gap energy of the well layer. Because of the increase in the band gap energy of the barrier layer, the height of the effective potential barrier is significantly increased, whereby the leakage current is further reduced. The same effect as described above is attained when the barrier layer comprises InGaP. Likewise, assuming that the well layer comprises $In_{0.7}Ga_{0.3}As$ and the barrier layer comprises $In_{0.53}Ga_{0.47}As$, the band gap energy of the well layer is reduced and the difference in band gap energies between the well layer and the barrier layer is increased. Also in this case, the height of the effective potential barrier is significantly increased, whereby the leakage current is further reduced.

Figure 7:
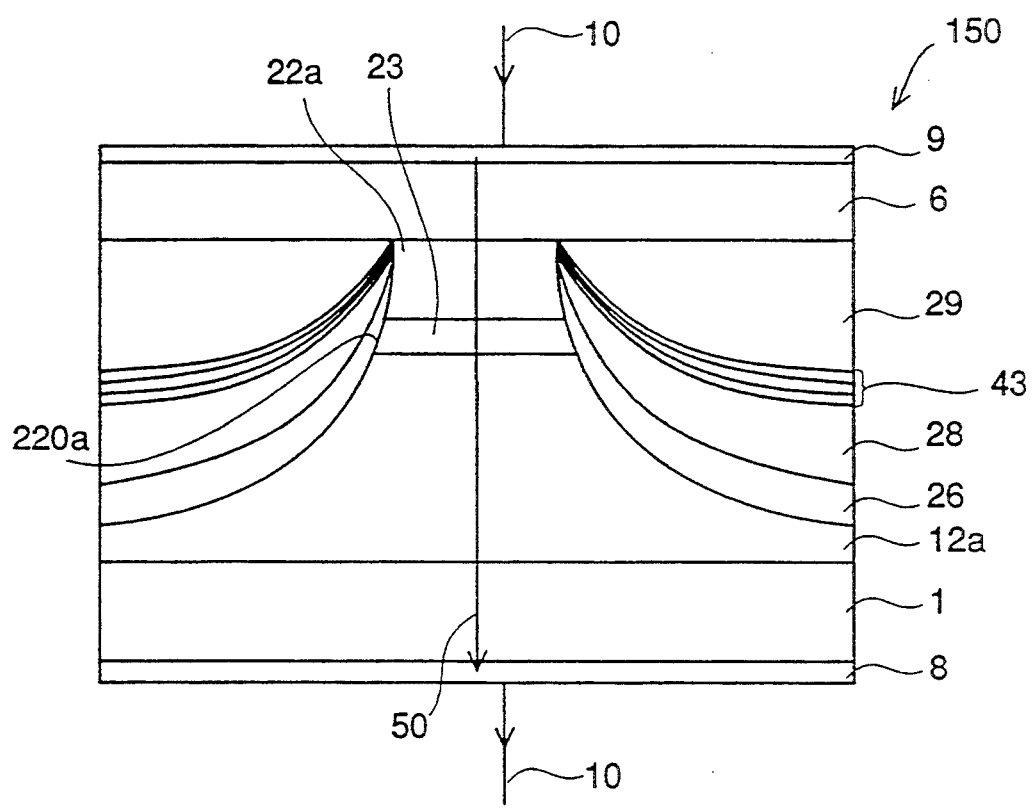
FIG. 7 is a sectional view schematically illustrating a buried heterostructure semiconductor laser in accordance with a fifth embodiment of the present invention.
Figure 17:
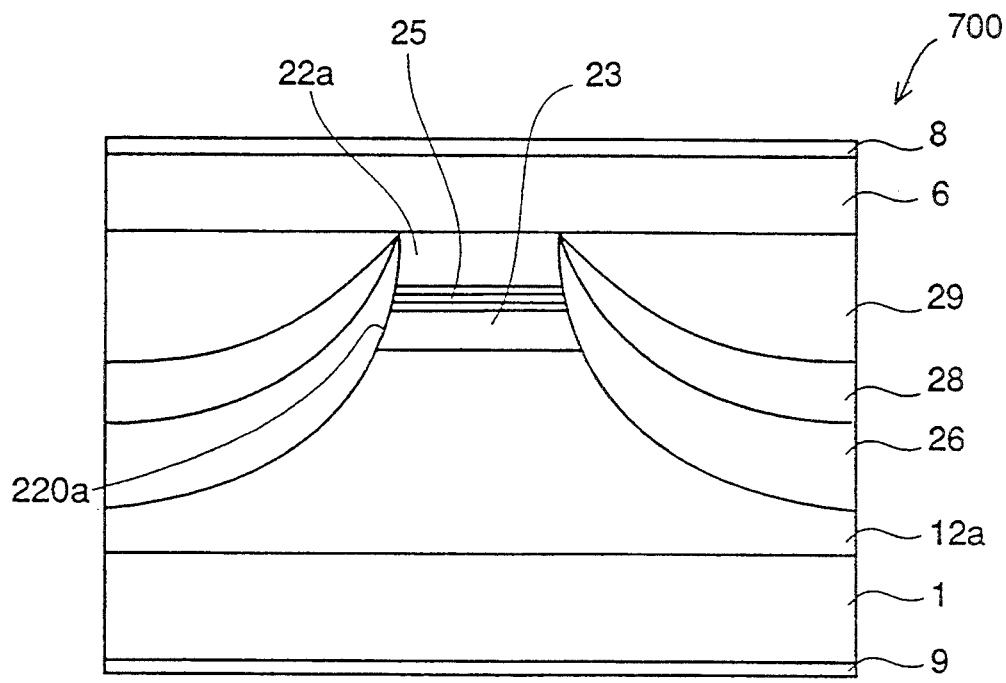
FIG. 17 is a sectional view illustrating a buried heterostructure semiconductor laser according to the prior art.
Figure 18:
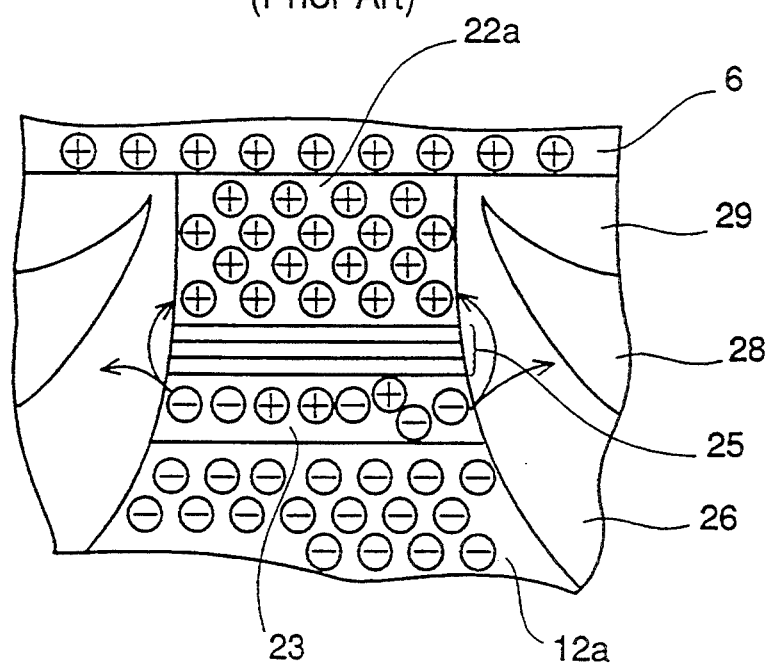
FIG. 18 is a sectional view illustrating a part of the buried heterostructure semiconductor laser shown in FIG. 17, for explaining transfer of electrons and holes in the vicinity of the active layer.

FIG. 7 is a sectional view schematically illustrating a BH laser in accordance with a fifth embodiment of the present invention. In the figure, the same reference numerals as those in FIG. 17 designate the same or corresponding parts. A BH layer 500 of this fifth embodiment includes an n type InP substrate 1. An n type InP lower cladding layer 12a is disposed on part of the substrate 1. An InGaAsP active layer 23 is disposed on the lower cladding layer 12a. A p type InP upper cladding layer 22a is disposed on the active layer 23. A stripe-shaped mesa structure 220a comprises the upper cladding layer 22a, the active layer 23, and the lower cladding layer 12a. A p type InP current blocking layer 26, an n type InP current blocking layer 28, a strained MQB layer 43, and an additional p type InP current blocking layer 29 are successively disposed on the lower cladding layer 12a, contacting the opposite sides of the mesa structure 220a. A p type InGaAsP contact layer 6 is disposed on the p type InP current blocking layer 29 and on the p type InP upper cladding layer 22a. A p side electrode 8 is disposed on the contact layer 6, and an n side electrode 9 is disposed on the rear surface of the substrate 1. The strained MQB layer 43 comprises, alternatingly arranged, ten to twenty InGaAsP well layers 2~50 nm thick and ten to twenty InGaP barrier layers 2~50 nm thick having a lattice constant that does not match with the lattice constant of InP.

In the BH laser 150 shown in FIG. 7, the conductivity types of the respective layers included in the stripe-shaped mesa structure 220 are opposite to those of the BH lasers according to the second to fourth embodiments. In the BH laser 150, current flows from the constant layer toward the substrate.

In the BH laser according to the fifth embodiment of the invention, the MQB layer 43 interposed between the n type InP current blocking layer 28 and the p type InP current blocking layer 29 provides the same potential barriers as described in the second embodiment at the junction between the n type InP current blocking layer 28 and the MQB layer 43 and at the junction between the p type InP current blocking layer 29 and the MQB layer 43. These potential barriers reduce the transfer of holes and electrons between the n type InP current blocking layer 28 and the p type InP current blocking layer 29, whereby unwanted turn-on of the pnpn thyristor structure comprising the p type layer 26, the n type layer 28, the p type layer 29, and then type layer 12a is avoided. Therefore, also in the BH laser 150, as in the second embodiment of the invention, the effective current 50 flowing into the active layer 23 of the mesa structure 220a is significantly increased by the reduction in the leakage current, whereby the light output is increased and the output characteristics and the temperature characteristics of the laser are improved compared to the prior art laser.

Although the BH laser 150 prevents the turn-on of the pnpn thyristor structure comprising the current blocking layers and the upper cladding layer, the BH laser 150 does not reduce the leakage current through the p type InP upper cladding layer 22a, the p type InP current blocking layer 26, and the n type InP lower cladding layer 12a. Therefore, an additional MQB layer 43 may be interposed between the side walls of the mesa structure 220a and the current blocking structure, as in the second embodiment of the invention, to suppress the transfer of holes and electrons between the p type InP current blocking layer 26 and the n type InP cladding layer 12a.

Figure 9:
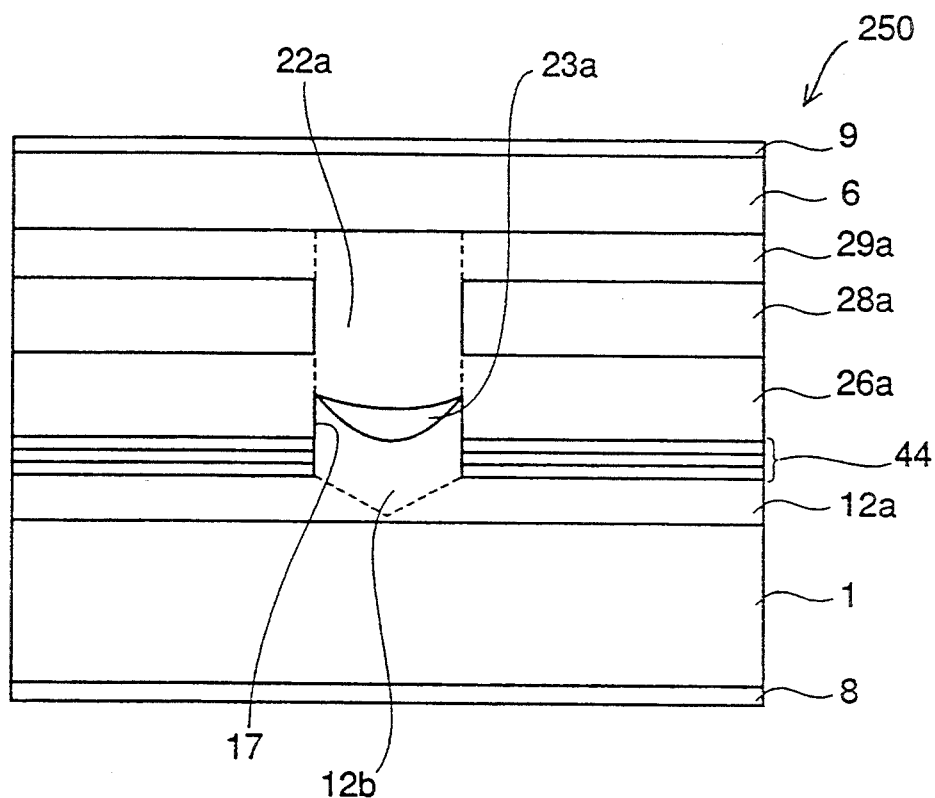
FIG. 9 is a sectional view schematically illustrating a buried crescent semiconductor laser in accordance with a sixth embodiment of the present invention.

FIG. 9 is a sectional view schematically illustrating a buried crescent semiconductor laser in accordance with a sixth embodiment of the present invention. In the figure, a buried crescent (hereinafter referred to as BC) laser 250 includes an n type InP substrate 1. A first n type InP lower cladding layer 12a is disposed on the substrate 1. A second n type InP lower cladding layer 12b is disposed on a central portion of the first lower cladding layer 12a. An InGaAsP active layer 23a having a crescent cross section is disposed on the second lower cladding layer 12b. A p type InP upper cladding layer 22a is disposed on the active layer 23a. An MQB layer 44 is disposed on the first lower cladding layer 12a where the second lower cladding layer 12b is absent, i.e., on both sides of and contacting the second lower cladding layer 12b. A current blocking structure comprising a p type InP layer 26a, an n type InP layer 28a, and an addition p type InP layer 29a is disposed on the MQB layer 44. A p type InGaAsP contact layer 6 is disposed on the p type InP layer 29a and on the upper cladding layer 22a. A p side electrode 8 is disposed on the contact layer 6, and an n side electrode 9 is disposed on the rear surface of the substrate 1. The MQB layer 44 comprises, alternatingly arranged, ten to twenty InGaAsP well layers 2~50 nm thick and ten to twenty InGaP barrier layers 2~50 nm thick.

Figure 10:
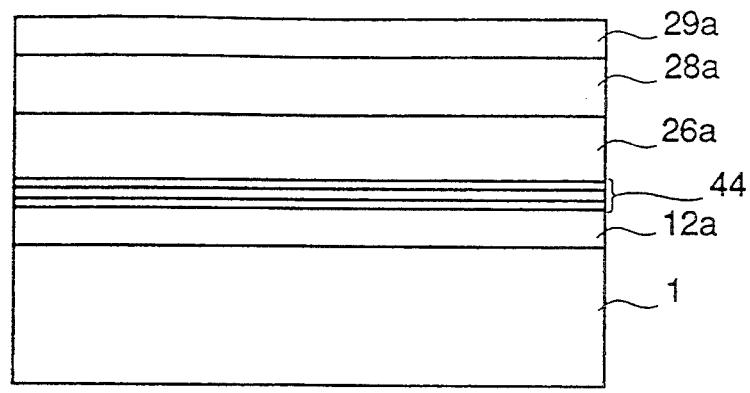
FIGS. 10(a)-10(c) are sectional views illustrating process steps in a method for fabricating the semiconductor laser of FIG. 9.
Figure 10:
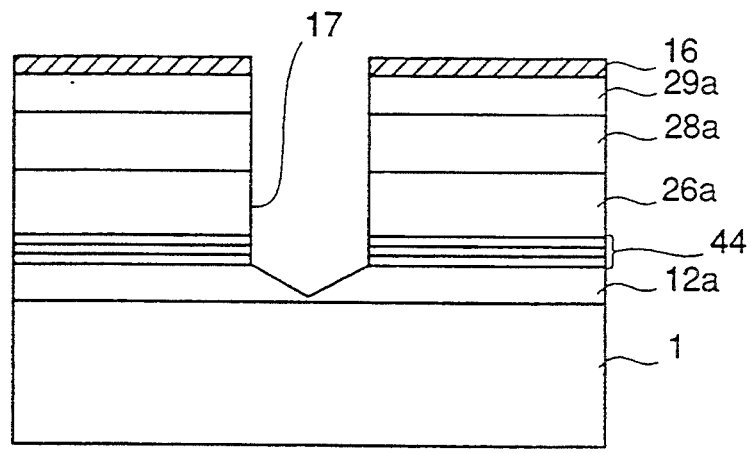
Figure 10:
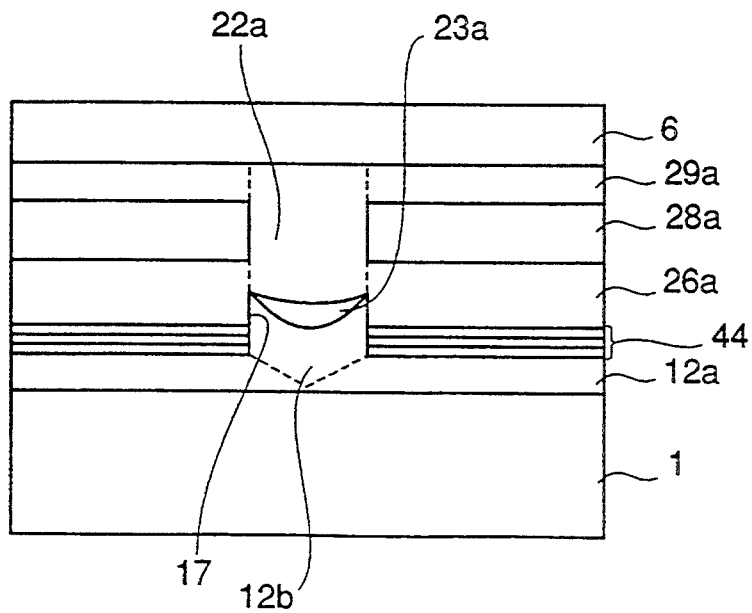

A method for fabricating the BC laser 250 is illustrated in FIGS. 10(a)-10(c).

Initially, as illustrated in FIG. 10(a), the first n type InP lower cladding layer 12a, the MQB layer 44, the p type InP current blocking layer 26a, the n type InP current blocking layer 28a, and the p type InP current blocking layer 29a are successively, epitaxially grown on the n type InP substrate 1, preferably by MOCVD or LPE.

Thereafter, a photoresist pattern 16 having a window of a prescribed width is formed on the p type InP current blocking layer 29a. Using the photoresist pattern 16 as a mask, those epitaxially grown layers are successively wet-etched with HCl until the etching front reaches the n type InP lower cladding layer 12a, producing a groove 17 as shown in FIG. 10(b).

After removal of the photoresist pattern 16, the second n type InP lower cladding layer 12b, the InGaAsP active layer 23a, and the p type InP upper cladding layer 22a are successively epitaxially grown in the groove 17 by LPE and, subsequently, the p type InGaAsP contact layer 6 is epitaxially grown on the upper cladding layer 22a and the current blocking layer 29a (FIG. 10(c)). To complete the laser structure 250 shown in FIG. 8, p side and n side electrodes 8 and 9 are formed on the contact layer 6 and the rear surface of the substrate 1, respectively.

In this BC laser 250, the MQB layer 44 interposed between the p type InP current blocking layer 26a and the n type InP lower cladding layer 12a provides the same potential barriers as described in the second embodiment at the junction between the p type InP current blocking layer 26a and the MQB layer 44 and at the junction between the n type InP lower cladding layer 12a and the MQB layer 44. These potential barriers reduce the transfer of holes and electrons between the p type InP current blocking layer 26a and the n type InP lower cladding layer, whereby unwanted turn-on of the pnpn thyristor structure comprising the current blocking layers 26a, 28a, and 29a and the lower cladding layer 12a is avoided. Therefore, the effective current flowing through the active layer 23a is increased by the reduction in the leakage current. As a result, the light output is increased and the output characteristics and the temperature characteristics of the laser are improved compared to the prior art laser.

While in the above-described sixth embodiment the first n type InP lower cladding layer 12a is formed on the n type InP substrate 1 and the groove 17 is formed so that the layer 12a is exposed at the bottom of the groove, the first n type InP lower cladding layer 12a can be dispensed with. In this case, the MQB layer 44 is grown on the n type InP substrate 1 and the groove 17 is formed so that the n type InP substrate 1 is exposed at the bottom of the groove. Also in this case, the same effects as described above are achieved.

While in the above-described sixth embodiment the MQB layer 44 is interposed between the n type InP lower cladding layer 12a and the p type InP current blocking layer 26a, the MQB layer 44 may be interposed between the p type InP current blocking layer 26a and the n type InP current blocking layer 28a or between the n type InP current blocking layer 28a and the p type InP current blocking layer 29a. A plurality of MQB layers may be disposed at these pn junctions. In all cases described above, since the turn-on of the pnpn thyristor structure is avoided, the same effects as described above are achieved.

Figure 11:
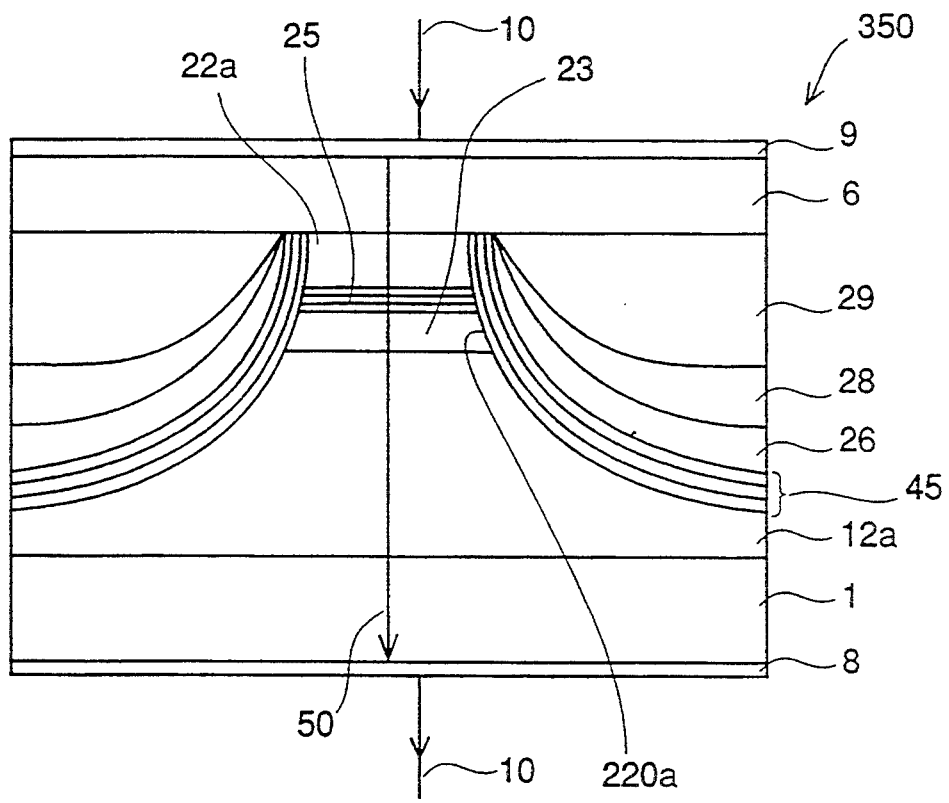
FIG. 11 is a sectional view schematically illustrating a buried heterostructure semiconductor laser in accordance with a seventh embodiment of the present invention.

FIG. 11 is a sectional view schematically illustrating a BH laser in accordance with a seventh embodiment of the present invention. In FIG. 11, the same reference numerals as in FIG. 17 designate the same or corresponding parts. A BH laser 350 shown in FIG. 11 is fundamentally identical to the prior art BH laser 700 shown in FIG. 17 except that MQB layers 45 are interposed between the opposite sides of the mesa structure 220a and the current blocking structure comprising the InP layers 26, 28, and 29. The MQB layer 45 comprises, alternatingly arranged, ten to twenty InGaAsP well layers 2~50 nm thick and ten to twenty InGaP barrier layers 2~50 nm thick. The production method of the BH laser 350 is fundamentally identical to the above-described production method of the prior art BH laser 700 shown in FIG. 17 except that the MQB layer 45 is grown contacting the opposite sides of the mesa structure 220a.

A description is given of the operation.

The fundamental operation of the BH laser 350 is identical to that of the prior art BH laser 700. In the BH laser 350, the MQB layer 25 provides a potential barrier between the InGaAsP active layer 23 and the p type InP upper cladding layer 22a. The potential barrier prevents electrons injected into the InGaAsP active layer 23 from the n type InP lower cladding layer 12a from flowing toward the p type InP upper cladding layer 22a. In addition, the MQB layer 45 interposed between the side wall of the mesa structure 220a and the current blocking structure provides a potential barrier that prevents those electrons injected into the InGaAsP active layer 23 from flowing toward the p type InP current blocking layer 26. Therefore, the electrons once injected into the active layer 23 are effectively confined in the active layer 23, resulting in a laser oscillation with excellent luminous efficiency.

In the BH laser 350 according to the seventh embodiment of the invention, electrons are effectively confined in the InGaAsP active layer 23 by the MQB layers 45. In addition, the MQB layer 45 provides a potential barrier between the p type InP current blocking layer 26 and the n type InP cladding layer 12a, and the potential barrier reduces the leakage current flowing through the p type InP upper cladding layer 22a, the p type InP current blocking layer 26, and the n type InP lower cladding layer 12a. Accordingly, the light output is significantly increased and the output characteristics and the temperature characteristics of the laser are significantly improved.

While in the above-described fifth to seventh embodiments a strained MQB layer comprising InGaAsP well layers that lattice-match with InP and InGaP barrier layers that do not lattice-match with InP are employed, an MQB layer comprising barrier layers and well layers that lattice-match with InP, as the MQB layer employed in the first to fourth embodiments, may be employed. Alternatively, a strained MQB layer comprising barrier layers that lattice-match with InP and well layers that do not lattice-match with InP may be employed.

While in the above-described first to seventh embodiments the semiconductor laser includes one MQB layer or two MQB layers, the laser may include three or more MQB layers corresponding to the leakage current paths produced in the laser structure, whereby the leakage current reducing effect is further improved.

In the foregoing description, emphasis has been placed upon an InP semiconductor laser. However, the present invention may be applied to other III-V compound semiconductor lasers, such as GaAs lasers.

What is claimed is:

1. A semiconductor laser comprising:
   a semiconductor substrate of a first conductivity type;
   a double heterojunction structure comprising a first conductivity type lower cladding layer disposed on the semiconductor substrate, an active layer disposed on the lower cladding layer, and an upper cladding layer of a second conductivity type, opposite the first conductivity type, disposed on the active layer, the double heterojunction structure having a ridge shape;
   a current blocking structure disposed on opposite sides of the ridge-shaped double heterojunction structure;
   a multiquantum barrier layer interposed between the opposite sides of the ridge-shaped double heterojunction structure and the current blocking structure; and
   first and second electrodes electrically contacting the semiconductor substrate and the upper cladding layer, respectively.

2. The semiconductor laser of claim 1 wherein said current blocking structure includes at least a first conductivity type semiconductor layer and a second conductivity type semiconductor layer and a second multiquantum barrier layer interposed between the first conductivity type semiconductor layer and the second conductivity type semiconductor layer.

3. A semiconductor laser comprising:
   a semiconductor substrate of a first conductivity type;
   a double heterojunction structure comprising a first conductivity type lower cladding layer disposed on the semiconductor substrate, an active layer disposed on the lower cladding layer, and an upper cladding layer of a second conductivity type, opposite the first conductivity type, disposed on the active layer, the double heterojunction structure having a ridge shape;
   a current blocking structure comprising a first semiconductor layer of the first or second conductivity type, a second semiconductor layer of a conductivity type opposite the first semiconductor layer, and a third semiconductor layer of the same conductivity type as the first semiconductor layer, successively disposed on opposite sides of the ridge-shaped double heterojunction structure;
   a multiquantum barrier layer disposed between at least one of the current blocking structure and the opposite sides of the double heterojunction structure, the first semiconductor layer and the second semiconductor layer, and the second semiconductor layer and the third semiconductor layer; and
   first and second electrodes electrically contacting the semiconductor substrate and the upper cladding layer, respectively.

4. A semiconductor laser comprising:
   a semiconductor substrate of a first conductivity type;
   a double heterojunction structure comprising a first conductivity type lower cladding layer disposed on the substrate, an active layer disposed on the lower cladding layer, and a first upper cladding layer of a second conductivity type, opposite the first conductivity type, disposed on the active layer, the double heterojunction structure having a ridge shape;
   a current blocking structure comprising a first semiconductor layer of the first conductivity, type, a second semiconductor layer of the second conductivity type, and a third semiconductor layer of the first conductivity type, successively disposed on opposite sides of the double heterojunction structure;
   a second upper cladding layer of the second conductivity type disposed on the first upper cladding layer and on the third semiconductor layer;
   a multiquantum barrier layer disposed between at least one of the current blocking structure and the opposite sides of the double heterojunction structure, the first semiconductor layer and the second semiconductor layer, the second semiconductor layer and the third semiconductor layer, and the third semiconductor layer and the second upper cladding layer; and
   first and second electrodes electrically contacting the semiconductor substrate and the upper cladding layer, respectively.

5. A semiconductor laser comprising:
   a semiconductor substrate of a first conductivity type;

a double heterojunction structure comprising a first conductivity type lower cladding layer disposed on the substrate, an active layer disposed on the lower cladding layer, and a first upper cladding layer of a second conductivity type, opposite the first conductivity type, disposed on the active layer, the double heterojunction structure having a ridge shape;

a current blocking structure disposed on opposite sides of the ridge-shaped double heterojunction structure;

a first multiquantum barrier layer interposed between the lower cladding layer and the active layer or between the active layer and the upper cladding layer;

a second multiquantum barrier layer interposed between the current blocking structure and the opposite sides of the ridge-shaped double heterojunction structure; and first and second electrodes electrically contacting the semiconductor substrate and the upper cladding layer, respectively.

6. The semiconductor laser of claim 5 wherein said current blocking structure includes at least a first conductivity type semiconductor layer and a second conductivity type semiconductor layer and a third multiquantum barrier layer interposed between the first conductivity type semiconductor layer and the second conductivity type semiconductor layer.

7. A semiconductor laser comprising:

a semiconductor substrate of a first conductivity type;

a current blocking structure comprising a first current blocking layer of a second conductivity type, opposite the first conductivity type, a second current blocking layer of the first conductivity type, and a third current blocking layer of the second conductivity type successively disposed on the semiconductor substrate;

a stripe-shaped groove having a prescribed width, penetrating through a part of the current blocking structure, and reaching into the first conductivity type semiconductor substrate;

a double heterojunction structure comprising a lower cladding layer of the first conductivity type, an active layer, and an upper cladding layer of the second conductivity type successively disposed in the stripe-shaped groove;

a multiquantum barrier layer disposed between at least one of the semiconductor substrate and the first current blocking layer, the first current blocking layer and the second current blocking layer, and the second current blocking layer and the third current blocking layer; and first and second electrodes electrically contacting the semiconductor substrate and the upper cladding layer, respectively.

8. A semiconductor laser comprising:

a semiconductor substrate of a first conductivity type;

a first lower cladding layer of the first conductivity type disposed on the substrate;

a current blocking structure comprising a first current blocking layer of a second conductivity type, opposite the first conductivity type, a second current blocking layer of the first conductivity type, and a third current blocking layer of the second conductivity type successively disposed on the first lower cladding layer;

a stripe-shaped groove having a prescribed width, penetrating through a part of the current blocking structure, and reaching into the first lower cladding layer;

a double heterojunction structure comprising a second lower cladding layer of the first conductivity type, an active layer, and an upper cladding layer of the second conductivity type successively disposed in the stripe-shaped groove;

a multiquantum barrier layer disposed between at least one of the first lower cladding layer and the first current blocking layer, the first current blocking layer and the second current blocking layer, and the second current blocking layer and the third current blocking layer; and first and second electrodes electrically contacting the semiconductor substrate and the upper cladding layer, respectively.

* * * * *